US012658856B2

(12) United States Patent
Komatsuzaki et al.

(10) Patent No.: US 12,658,856 B2
(45) Date of Patent: Jun. 16, 2026

(54) DOHERTY AMPLIFIER

(71) Applicant: Mitsubishi Electric Corporation, Tokyo (JP)

(72) Inventors: Yuji Komatsuzaki, Tokyo (JP); Shuichi Sakata, Tokyo (JP); Koji Yamanaka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 481 days.

(21) Appl. No.: 18/243,729

(22) Filed: Sep. 8, 2023

(65) Prior Publication Data

US 2023/0421107 A1      Dec. 28, 2023

Related U.S. Application Data

(63) Continuation of application No. PCT/JP2021/015695, filed on Apr. 16, 2021.

(51) Int. Cl.
| | |
|---|---|
| *H03F 1/02* | (2006.01) |
| *H03F 1/56* | (2006.01) |
| *H03F 3/68* | (2006.01) |

(52) U.S. Cl.
CPC ............. *H03F 1/0288* (2013.01); *H03F 1/56* (2013.01); *H03F 3/68* (2013.01); *H03F 2200/423* (2013.01)

(58) Field of Classification Search
None
See application file for complete search history.

(56) References Cited

U.S. PATENT DOCUMENTS

| | | | |
|---|---|---|---|
| 11,133,781 B2 | 9/2021 | Nakatani et al. | |
| 2011/0210786 A1* | 9/2011 | Blednov | H03H 7/38 |
| | | | 330/124 R |
| 2023/0040780 A1* | 2/2023 | Liu | H03F 3/217 |

FOREIGN PATENT DOCUMENTS

| | | |
|---|---|---|
| JP | 6729986 B2 | 7/2020 |
| WO | WO 2019/009760 A1 | 1/2019 |

OTHER PUBLICATIONS

Andersson et al., "A 1-3-GHz Digitally Controlled Dual-RF Input Power-Amplifier Design Based on a Doherty-Outphasing Continuum Analysis", IEEE Transactions on Microwave Theory and Techniques, vol. 61, No. 10, Oct. 2013, pp. 3743-3752.

(Continued)

*Primary Examiner* — Andrea Lindgren Baltzell
*Assistant Examiner* — Malane Lieng
(74) *Attorney, Agent, or Firm* — Birch, Stewart, Kolasch & Birch, LLP

(57) ABSTRACT

A Doherty amplifier includes: a first filter circuit to output a first input signal obtained by attenuating an input signal lying in a first frequency band, and to output a second input signal obtained by allowing passage of an input signal lying in a second frequency band; a second filter circuit to output a third input signal obtained by attenuating an input signal lying in the first frequency band, and to output a fourth input signal obtained by attenuating an input signal lying in the second frequency band; a first amplifier to operate as an auxiliary amplifier when receiving the first input signal, and to operate as a main amplifier when receiving the second input signal; and a second amplifier tip operate as the main amplifier when receiving the third input signal, and to operate as the auxiliary amplifier when receiving the fourth input signal.

18 Claims, 6 Drawing Sheets

(56)　　　　　References Cited

OTHER PUBLICATIONS

International Search Report (PCT/ISA/210) issued in PCT/JP2021/015695, mailed on Jun. 8, 2021.
Komatsuzaki et al., "A Dual-Mode Bias Circuit Enabled GaN Doherty Amplifier Operating in 0.85-2.05GHz and 2.4-4.2GHz", 2020 IEEE/MTT-S International Microwave Symposium (IMS), Aug. 4-6, 2020, pp. 277-280.

* cited by examiner

FIG. 9

DOHERTY AMPLIFIER

CROSS REFERENCE TO RELATED APPLICATIONS

This application is a Continuation of PCT International Application No, PCT/JP2021/015695 filed on Apr. 16, 2021, which is hereby expressly incorporated by reference into the present application.

TECHNICAL FIELD

The present disclosure relates to a Doherty amplifier that operates in multiple frequency bands.

BACKGROUND ART

In recent years, because of a dramatic increase in communications traffic, it is required that, for example, amplifiers for 5th-generation mobile communication base stations can amplify a signal with a large peak to average power ratio (PAPR) with a high degree of efficiency.

As an amplifier that amplifies a signal for communications with a high degree of efficiency, a Doherty amplifier is proposed in Patent Literature 1.

The Doherty amplifier shown in Patent Literature 1 is one in which a control unit switches the class of operation for each of first and second amplifying elements in accordance with whether the operating frequency of an input signal is a first operating frequency or a second operating frequency.

CITATION LIST

Patent Literature

Patent Literature 1: WO 2019/09760

SUMMARY OF INVENTION

Technical Problem

On the other hand, it is desired that a Doherty amplifier that amplifies input signals of two operating frequencies without controlling the two amplifying elements that constitute the Doherty amplifier is implemented.

The present disclosure is provided in view of the above-mentioned point, and it is an object of the present disclosure to provide a Doherty amplifier that operates in multiple frequency bands without having to control the amplifying elements which constitute the Doherty amplifier.

Solution to Problem

A Doherty amplifier according to the present disclosure includes: a first filter circuit to, when an input signal lying in a first frequency band is inputted, output a first input signal obtained by attenuating the input signal lying in the first frequency band by a first amount of attenuation, and to, when an input signal lying in a second frequency band different from the first frequency band is inputted output a second input signal obtained by allowing passage of the input signal lying in the second frequency band; a second filter circuit to, when an input signal lying in the first frequency band is inputted, output a third input signal obtained by attenuating the input signal lying in the first frequency band by a second amount of attenuation smaller than the first amount of attenuation, and to, when an input signal lying in the second frequency band is inputted, output a fourth input signal obtained by attenuating the input signal lying in the second frequency band by a third amount of attenuation larger than or equal to the first amount of attenuation; a first amplifier in which a gate bias voltage is fixed, to operate as an auxiliary amplifier when the first input signal from the first filter circuit is inputted, and to operate as a main amplifier when the second input signal from the first filter circuit is inputted; and a second amplifier in which a gate bias voltage is fixed, to operate as the main amplifier when the third input signal from the second filter circuit is inputted, and to operate as the auxiliary amplifier when the fourth input signal from the second filter circuit is inputted.

Advantageous Effects of Invention

According to the present disclosure, because the first filter circuit and the second filter circuit which have different characteristics are disposed as stages preceding the first amplifier and the second amplifier, the Doherty amplifier operates in the multiple frequency bands without having to control the first amplifier and the second amplifier.

BRIEF DESCRIPTION OF DRAWINGS

FIG. 9 is a view schematically showing the functions of the first amplifier and the second amplifier when an input signal lying in a first frequency band is inputted and when an input signal lying in a second frequency band is inputted in the Doherty amplifier according to Embodiment 1.

DESCRIPTION OF EMBODIMENTS

Embodiment 1

Figure 1:
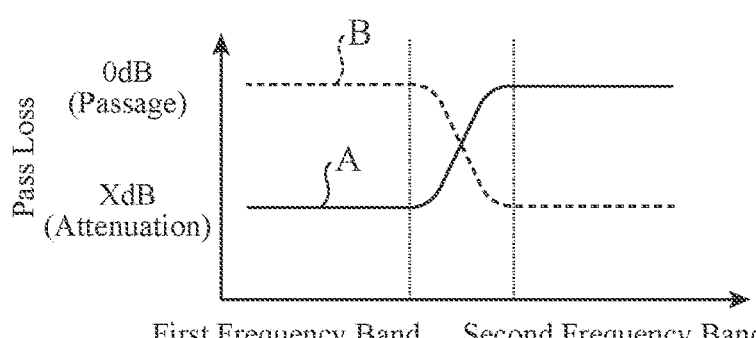
FIG. 1 is a block diagram showing a Doherty amplifier according to Embodiment 1.

A Doherty amplifier according to Embodiment 1 will be explained on the basis of FIGS. 1 to 10.

The Doherty amplifier operates in two operating frequency bands: a first frequency band and a second frequency band.

The first frequency band and the second frequency band are different frequency ranges, and the first frequency band is a frequency range lower than the second frequency band. For the sake of convenience, the first frequency band is referred to as a low frequency range showing a frequency range lower than the second frequency band, and the second frequency band is referred to as a high frequency range showing a frequency range higher than the first frequency band.

In the Doherty amplifier, a gate bias voltage applied to each of two amplifiers in parallel is fixed to one at which each of the amplifiers operates as a class B amplifier, and two filter circuits connected as stages preceding the two parallel amplifiers cause each of the two parallel amplifiers to switch between a main amplifier function and an auxiliary amplifier function according to the two operating frequency bands in which the pass losses in these operating frequency bands are made to differ from each other.

In the two parallel amplifiers, two amplifiers: main and auxiliary amplifiers with equal saturation output power are connected in parallel.

Input signals inputted to the two parallel amplifiers satisfy a relation showing that when a second frequency in the second frequency band is assumed to be 1.0, a first frequency in the first frequency band is 0.5 with respect to the second frequency.

The Doherty amplifier includes, between an input terminal 1 and an output terminal 2, a third input matching circuit 3, a splitter 4, a phase correction circuit 5, a first filter circuit 6a, a second filter circuit 6b, a first input matching circuit 7a, a second input matching circuit 7b, the two parallel amplifiers 8 having a first amplifier 8a and a second amplifier 8b, an output combination circuit 9 having a first output circuit 9a and a second output circuit 9b, and an output matching circuit 10.

The third input matching circuit 3 is connected between the input terminal 1 and an input end of the splitter 4, and performs impedance matching between the input terminal 1 and the splitter 4.

The third input matching circuit 3 is an impedance matching network (IMN) that includes a matching circuit using a lumped constant element, a matching circuit using a distributed constant line, a matching circuit which is a combination of a lumped constant and a distributed constant, a matching circuit using an LC matching circuit, or the like.

The splitter 4 has an input end connected to an output end of the third input matching circuit 3, an output end connected to an input end of the phase correction circuit 5, and another output end connected to the second filter circuit 6b, and splits an input signal inputted thereto from the input terminal 1 to an input signal at the output end thereof and an input signal at the other output end thereof.

The splitter 4 is a Wilkinson splitter, a hybrid circuit, or the like which is comprised of a circuit using a lumped constant element, a circuit using a distributed to constant line, a circuit which is a combination of a lumped constant and a distributed constant, a circuit using an LC matching circuit, or the like.

The phase correction circuit 5 is connected between the output end of the splitter 4 and an input end of the first finer circuit 6a, and causes the electric length from the output end of the splitter 4 to an output combination point 9A which is an output end of the output combination circuit 9, i.e., the electric length of a path on a side of the first amplifier 8a to be equal to the electric length from the other output end of the splitter 4 to the output combination point 9A of the output combination circuit 9, i.e., the electric length of a path on a side of the second amplifier 8b.

The phase correction circuit 5 is comprised of a circuit using a lumped constant element, a circuit using a distributed constant line, a circuit which is a combination of a lumped constant and a distributed constant, a circuit using an LC matching circuit, or the like.

The input end of the first filter circuit 6a is connected to an output end of the phase correction circuit 5, and the first filter circuit 6a receives the input signal outputted from the output end of the splitter 4 and inputted thereto via the phase correction circuit 5.

When an input signal lying in the first frequency band is inputted, the first filter circuit 6a outputs a first input signal obtained by attenuating the input signal lying in the first frequency band by a first amount of attenuation XdB, and when an input signal lying in the second frequency band is inputted, the first filter circuit 6a outputs a second input signal obtained by allowing passage of the input signal lying in the second frequency band.

When the input signal lies in the first frequency band, the first filter circuit 6a outputs a signal having a small amplitude because the first input signal is attenuated by XdB, and when the input signal lies in the second frequency band, the first filter circuit 6a outputs a signal having a large amplitude because the second input signal is not attenuated.

The above-mentioned amplitude of the input signal refers to the amplitude of the envelope of the signal. The amplitude of an input signal, which will be explained below, also refers to the amplitude of the envelope of the signal.

Figure 4:
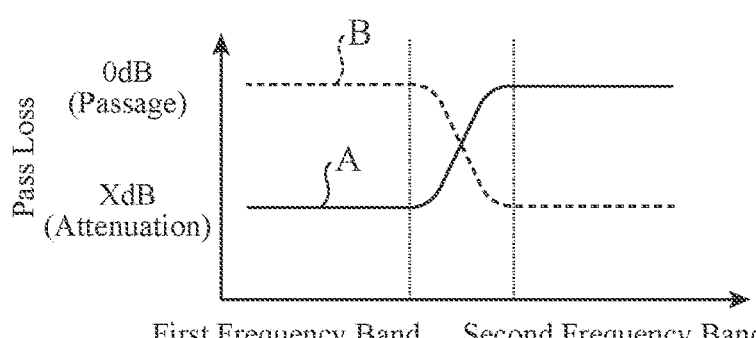
FIG. 4 is a view showing a pass loss with respect to frequencies in a first filter circuit and a second filter circuit in the Doherty amplifier according to Embodiment 1.

The first filter circuit 6a is a high pass filter circuit in which the amount of attenuation in the first frequency band is set to XdB, and the amount of attenuation in the second frequency band is set to 0 dB (passage), as shown by a solid line A in FIG. 4.

The first filter circuit 6a is a reactive high pass filter circuit comprised of a reactive reflection loss, such as a filter circuit using a lumped constant element, a filter circuit using a distributed constant line, a filter circuit which is a combination of a lumped constant and a distributed constant, or a filter circuit using an LC matching circuit.

In a case where a reactive high pass filter circuit is used as the first filter circuit 6a, the downsizing of the first filter circuit 6a can be achieved.

As the first filter circuit 6a, a resistive high pass filter circuit such as an attenuator, instead of a reactive high pass filter circuit, may be used.

In a case where a resistive high pass filter circuit is used as the first filter circuit 6a, operational stability can be provided for the first amplifier 8a because the reflection power is lost in the first filter circuit 6a.

The second filter circuit 6b has an input end connected to the other output end of the splitter 4, and receives the input signal outputted from the other output end of the splitter 4 and inputted thereto.

When an input signal lying in the first frequency band is inputted, the second filter circuit 6b outputs a third input signal obtained by allowing passage of the input signal lying in the first frequency band, and when an input signal lying in the second frequency band is inputted, the second filter circuit 6b outputs a fourth input signal obtained by attenuating the input signal lying in the second frequency band by the first amount of attenuation XdB.

When the input signal lies in the first frequency band, the second filter circuit 6b outputs a signal having a large amplitude because the third input signal is not attenuated, and when the input signal lies in the second frequency band, the second filter circuit 6b outputs a signal having a small amplitude because the fourth input signal is attenuated by XdB.

The second filter circuit 6b is a low pass filter circuit in which the amount of attenuation in the first frequency band is set to 0 dB (passage), and the amount of attenuation in the second frequency band is set to XdB, as shown by a solid line Bin FIG. 4.

The second filter circuit 6b is a reactive low pass filter circuit comprised of a reactive reflection loss, such as a filter circuit using a lumped constant element, a filter circuit using a distributed constant line, a filter circuit which is a combination of a lumped constant and a distributed constant, or a filter circuit using an LC matching circuit.

In a case where a reactive high pass filter circuit is used as the second filter circuit 6b, the downsizing of the second filter circuit 6b can be achieved. As the second filter circuit 6b, a resistive low pass filter circuit such as an attenuator, instead of a reactive low pass filter circuit, may be used.

In a case where a resistive high pass filter circuit is used as the second filter circuit 6b, operational stability can be provided for the second amplifier 8b because the reflection power is lost in the second filter circuit 6b.

Although when the input signal lies in the first frequency band, the second filter circuit 6b outputs, as the third input signal, the signal which the second filter circuit does not attenuate (the amount of attenuation is 0 dB: passage), the second filter circuit 6b may output, as the third input signal, the signal which the second filter circuit attenuates by a second amount of attenuation smaller than the first amount of attenuation XdB.

Further, although when the input signal lies in the second frequency band, the second filter circuit 6b outputs, as the fourth input signal, the signal which the second filter circuit attenuates by the first amount of attenuation XdB, the second filter circuit 6b may output, as the fourth input signal, the signal which the second filter circuit attenuates by a third amount of attenuation larger than or equal to the first amount of attenuation XdB.

To sum up, what is necessary is just to set up the characteristics of the first filter circuit 6a and the second filter circuit 6b in such a way that when the input signal lies in the first frequency band, the amplitude of the first input signal outputted from the first filter circuit 6a is smaller than the amplitude of the third input signal outputted from the second filter circuit 6b, whereas when the input signal lies in the second frequency band, the amplitude of the second input signal outputted from the first filter circuit 6a is larger than the amplitude of the fourth input signal outputted from the second filter circuit 6b.

The amount of attenuation XdB in the first filter circuit 6a with respect to the first frequency band and the amount of attenuation XdB in the second filter circuit 6b with respect to the second frequency band are set to 6 dB, as an example, when it is desirable to improve the efficiency of each of the first and second amplifiers 8a and 8b, or are set to 3 dB, as an example, when it is desirable to balance the efficiency and linearity of each of the first and second amplifiers 8a and 8b.

The first input matching circuit 7a is an impedance matching network (IMN) which is connected between an output end of the first filter circuit 6a and an input end Sal of the first amplifier 8a, and which performs input matching with the first amplifier 8a.

The first input matching circuit 7a is an impedance matching network (INN) which is comprised of a matching circuit using a lumped constant element, a matching circuit using a distributed constant line, a matching circuit which is a combination of a lumped constant and a distributed constant, a matching circuit using an LC matching circuit, or the like.

The first input matching circuit 7a may be connected between the output end of the phase correction circuit 5 and the input end of the first filter circuit 6a.

The second input matching circuit 7b is an impedance matching network (MN) which is connected between an output end of the second filter circuit 6b and an input end 8b1 of the second amplifier 8b, and which performs input matching with the second amplifier 8b.

The second input matching circuit 7b is an impedance matching network (IMN) which is comprised of a matching circuit using a lumped constant element, a matching circuit using a distributed constant line, a matching circuit which is a combination of a lumped constant and a distributed constant, a matching circuit using an LC matching circuit, or the like.

The second input matching circuit 7b may be connected between the other output end of the splitter 4 and the input end of the second filter circuit 6b.

The two parallel amplifiers 8 is comprised of the first amplifier 8a and the second amplifier 8b, and each of the first and second amplifiers 8a and 8b is biased to a threshold voltage at which each of the amplifiers operates as a class B amplifier, i.e., the threshold voltage of a transistor which constitutes each of the first and second amplifiers 8a and 8b.

The threshold voltage in the present disclosure contains the value of the threshold voltage itself and even a plus or minus design tolerance value with respect to the value of the threshold voltage.

The input end 8a1 of the first amplifier 8a is connected to a gate bias terminal 11a at which the gate bias voltage is fixed, and when the first input signal outputted to from the first filter circuit 6a is inputted to the input end 8a1 via the first input matching circuit 7a, the first amplifier 8a starts at a time later than the second amplifier 8b and operates as the auxiliary amplifier because the amplitude of the first input signal is smaller than the amplitude of the third input signal, whereas when the second input signal outputted from the first filter circuit 6a is inputted to the input end 8a1, the first ft amplifier 8a starts at a time earlier than the second amplifier 8b and operates as the main amplifier because the amplitude of the second input signal is larger than the amplitude of the fourth input signal.

More specifically, the first amplifier 8a operates as the auxiliary amplifier when the input signal inputted to the input terminal 1 lies in the first frequency hand, whereas the first amplifier 8a operates as the main amplifier when the input signal inputted to the input terminal 1 lies in the second frequency band.

In the first amplifier 8a, the saturation output power when operating as the main amplifier and the saturation output power when operating as the auxiliary amplifier are equal.

As the first amplifier 8a, a transistor such as a field effect transistor (FET), a heterojunction bipolar transistor (HBT), or a high electron mobility transistor (HEMT) is used.

The first amplifier 8a may include circuit configuration elements needed as the amplifier, such as a stabilization circuit connected to an input side of the transistor and a bias circuit connected to an output side of the transistor.

The transistor as the first amplifier 8a has a gate electrode serving as the input end Sal, a drain electrode serving as an output end 8a2 and connected, via a load resistor, to a power supply potential Vcc, and a source electrode connected to a ground node.

The input end 8a1 is connected to the gate bias terminal 11a, and the gate bias terminal 11a is connected to the power supply potential Vcc via a resistive element (bias resister).

To the gate bias terminal 11a is applied the threshold voltage of the transistor in such a way that the transistor as the first amplifier 8a operates as a class B amplifier.

Figure 2:
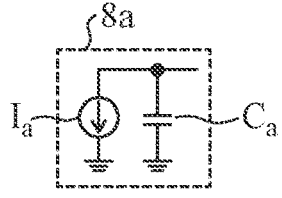
FIG. 2 is an equivalent circuit diagram showing a first amplifier in the Doherty amplifier according to Embodiment 1.

An equivalent circuit of the first amplifier 8a is shown in FIG. 2. More specifically, it is assumed that the first amplifier 8a is comprised of a current source Ia which is based on a current flowing between the drain and the source of the transistor, and an output capacitance Ca which is a parasitic capacitance between the drain of the transistor and the ground.

The output capacitance Ca of the first amplifier 8a is compensated for by an inductor or the like or incorporated as a part of the first output circuit 9a, and the current source Ia is connected directly to the first output circuit 9a from the viewpoint of electric lengths.

The input end 8b1 of the second amplifier 8b is connected to a gate bias terminal 11b at which the gate bias voltage is fixed, and when the third input signal outputted from the second filter circuit 6b is inputted to the input end 8b1 via the second input matching circuit 7b, the second amplifier lib starts at a time earlier than the first amplifier 8a and operates as the main amplifier because the amplitude of the third input signal is larger than the amplitude of the first input signal, Whereas when the fourth input signal outputted from the second filter circuit 6b is inputted to the input end 8b1, the second amplifier 8b starts at a time later than the first amplifier 8a and operates as the auxiliary amplifier because the amplitude of the fourth input signal is smaller than the amplitude of the second input signal.

More specifically, the second amplifier 8b operates as the main amplifier when the input signal inputted to the input terminal 1 lies in the first frequency band, whereas the second amplifier 8b operates as the auxiliary amplifier when the input signal inputted to the input terminal 1 lies in the second frequency band.

In the second amplifier 8b, the saturation output power when operating as the main amplifier and the saturation output power when operating as the auxiliary amplifier are equal.

As the second amplifier 8b, a transistor such as an FET, an HBT, or a HEMT is used.

The second amplifier 8b may include circuit configuration elements needed as the amplifier, such as a stabilization circuit connected to an input side of the transistor and a bias circuit connected to an output side of the transistor.

The transistor as the second amplifier 8b has a gate electrode serving as the so input end 8b1, a drain electrode serving as an output end 8b2 and connected, via a load resistor, to the power supply potential Vcc, and a source electrode connected to a ground node.

The input end 8b1 is connected to the gate bias terminal 11b, and the gate bias terminal 11b is connected to the power supply potential Vcc via a resistive element (bias resister).

To the gate bias terminal 11b is applied the threshold voltage of the transistor in such a way that the transistor as the first amplifier 8a operates as a class B amplifier.

The gate bias terminal 11b may also serve as the gate bias terminal 11a.

Figure 3:
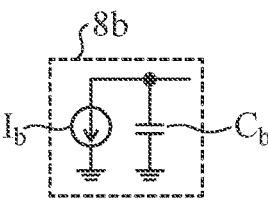
FIG. 3 is an equivalent circuit diagram showing a second amplifier in the Doherty amplifier according to Embodiment 1.

An equivalent circuit of the second amplifier 8b is shown in FIG. 3. More specifically, it is assumed that the second amplifier 8b is comprised of: a current source Ib which is based on a current flowing between the drain and the source of the transistor; and an output capacitance Cb which is a parasitic capacitance between the drain of the transistor and the ground.

The output capacitance Cb of the second amplifier 8b is compensated for by an inductor or the like or incorporated as a part of the second output circuit 9b, and the current source Ib is connected directly to the second output circuit 9b from the viewpoint of electric lengths.

To sum up, although the functions and configurations of the first amplifier 8a and the second amplifier 8b are the same, the times that the first amplifier 8a and the second amplifier 8b start differ because the amplitudes of the input signals inputted to the first amplifier 8a and the second amplifier 8b differ because of the first filter circuit 6a and the second filter circuit 6b.

Because of the difference between the times that the first amplifier 8a and the second amplifier 8b start, the output load impedances of the first amplifier 8a and the second amplifier 8b differ.

When the input signal lies in the first frequency band, the time that the second so amplifier 8b starts is earlier than the time that the first amplifier 8a starts, and the second amplifier 8b functions as the main amplifier while the first amplifier 8a functions as the auxiliary amplifier.

The output load impedance of the first amplifier 8a is sufficiently higher than that of the second amplifier 8b, for example, the output load impedance of the first amplifier 8a is ten or more times as high as that of the second amplifier 8b, and it can be regarded from the viewpoint of the load modulation of the Doherty amplifier that the first amplifier 8a is placed in an off state and the output end 8a2 of the first amplifier 8a is open.

At this time, because an output circuit having an electric length close to 90 degrees is provided on an output side of the second amplifier 8b because of the first output circuit 9a and the second output circuit 9b, and the output of the second amplifier 8b is in a load condition that a high degree of efficiency is achieved even at the time of low power output, the second amplifier 8b operates with a high degree of efficiency even at the time of low power output.

In contrast, when the input signal lies in the second frequency band, the time that the first amplifier 8a starts is earlier than the time that the second amplifier 8b starts, and the output load impedance of the second amplifier 8b is sufficiently higher than that of the first amplifier 8a, for example, the output load impedance of the second amplifier 8*b* is ten or more times as high as that of the first amplifier 8*a*, and it can be assumed from the viewpoint of the load modulation of the Doherty amplifier that the second amplifier 8*b* is placed in an off state and the output end 8*b*2 of the second amplifier 8*b* is open.

As a result, the first amplifier 8*a* functions as the main amplifier while the second amplifier 8*b* functions as the auxiliary amplifier.

At this time, because an output circuit having an electric length close to 90 degrees is provided on an output side of the first amplifier 8*a* because of the first output circuit 9*a* and the second output circuit 9*b*, and the output of the first amplifier 8*a* is in a load condition that a high degree of efficiency is achieved even at the time of low power output, the first amplifier 8*a* operates with a high degree of efficiency even at the time of low power output.

The output combination circuit 9 is comprised of the first output circuit 9*a* and the second output circuit 9*b*, and, at the time of a backoff operation, enlarges the output load (output reflection coefficient) of the main amplifier when the first amplifier 8*a* or the second amplifier 8*b* functions as the main amplifier in accordance with the frequency.

The first output circuit 9*a* modulates the output load on the first amplifier 8*a*.

The first output circuit 9*a* has an input end connected to the output end of the first amplifier 8*a*, and an output end connected to the output combination point 9A.

The first output circuit 9*a* is a transmission line having an electric length which is less than 90 degrees with respect to the first frequency band, and which is equal to 90 degrees with respect to the second frequency band, and its characteristic impedance is equal to an optimum load impedance at the time of the saturation power of the first amplifier 8*a*.

The first output circuit 9*a* is not limited to the transmission line, and should just satisfy the above-mentioned requirements.

In the first output circuit 9*a*, the value which is less than 90 degrees with respect to the first frequency band ranges from less than 90 degrees to 45 degrees, for example.

Further, the value of the electric length which is equal to 90 degrees with respect to the second frequency band contains 90 degrees itself and even a plus or minus design tolerance value with respect to the value of 90 degrees at which the load modulation making it possible to expect that the first amplifier 8*a* operates with the highest degree of efficiency in the second frequency band is established.

The second output circuit 9*b* modulates the output load on the second amplifier 8*b*.

The second output circuit 9*b* has an input end connected to the output end of the second amplifier 8*b*, and an output end connected to the output combination point 9A.

The second output circuit 9*b* is a transmission line having an electric length which is greater than 90 degrees with respect to the first frequency band, and which is equal to 180 degrees with respect to the second frequency band, and its characteristic impedance is equal to an optimum load impedance at the time of the saturation power of the second amplifier 8*b*.

The second output circuit 9*b* is not limited to the transmission line, and should just satisfy the above-mentioned requirements.

In the second output circuit 9*b*, the value of the electric length which is greater than 90 degrees with respect to the first frequency band ranges from more than 90 degrees to (90+16) degrees, for example.

Further, the value of the electric length which is equal to 180 degrees with respect to the second frequency band contains 180 degrees itself and even a plus or minus design tolerance value with respect to the value of 180 degrees at which the second amplifier 8*b* is placed in an off state in the second frequency band, the open load of the output end 8*b*2 is propagated, and the output end of the second output circuit 9*b* is open.

To sum up, the output combination circuit 9 should just have the characteristic of, at the time of the backoff operation, enlarging the output load (output reflection coefficient) of the main amplifier when the first amplifier 8*a* or the second amplifier 8*b* functions as the main amplifier in accordance with the frequency.

More specifically, the first output circuit 9*a* and the second output circuit 9*b* should just be configured in such a way as to have the characteristic of enlarging the output load (output reflection coefficient) of the first amplifier 8*a* in accordance with the frequency of the input signal because the first amplifier 8*a* functions as the main amplifier when the frequency band of the input signal is the second frequency band, and enlarging the output load (output reflection coefficient) of the second amplifier 8*b* in accordance with the frequency of the input signal because the second amplifier 8*b* functions as the main amplifier when the frequency hand of the input signal is the first frequency hand.

No isolation is provided between the output end 8*a*2 of the first amplifier 8*a* and the output end 8*b*2 of the second amplifier 8*b* by the first output circuit 9*a*—the output combination point 9A—the second output circuit 9*b*.

When an input signal lying in the second frequency band is inputted to the input terminal 1, the first amplifier 8*a* functions as the main amplifier in response to a second input signal lying in the second frequency band, and the second amplifier 8*b* functions as the auxiliary amplifier in response to a fourth input signal lying in the second frequency band, the transmission line of 90 degrees provided by the first output circuit 9*a* is connected to the output end 8*a*2 of the first amplifier 8*a*, and load modulation occurs in the first amplifier 8*a*, which functions as the main amplifier, more specifically, its apparent load impedance varies because of the transmission line of 180 degrees provided by the second output circuit 9*b* which is connected to the output end 8*b*2 of the second amplifier 8*b*.

As a result, when an input signal lying in the second frequency band is inputted to the input terminal 1, the Doherty amplifier implements a high-efficiency operation at the backoff operating point where the output power is lower than the saturation power.

Further, when an input signal lying in the first frequency band is inputted to the input terminal 1, the first amplifier 8*a* functions as the auxiliary amplifier in response to a first input signal lying in the first frequency band, and the second amplifier 8*b* functions as the main amplifier in response to a third input signal lying in the first frequency band, the transmission line of more than 90 degrees provided by the second output circuit 9*b* is connected to the output end 8*b*2 of the second amplifier 8*b*, and load modulation occurs in the second amplifier 8*b*, which functions as the main amplifier, more specifically, its apparent load impedance varies because of the transmission line of less than 90 degrees provided by the first output circuit 9*a* which is connected to the output end 8*a*2 of the first amplifier 8*a*.

As a result, also when an input signal lying in the first frequency band is inputted to the input terminal 1, the Doherty amplifier implements a high-efficiency operation at the backoff operating point where the output power is lower than the saturation power.

The output matching circuit 10 is connected between the output combination point 9A of the output combination circuit 9 and the output terminal 2, and performs impedance matching between the impedance of the output combination point 9A and the impedance of a load connected to the output terminal 2.

As the output matching circuit 10, a circuit using a lumped constant element, a circuit using a distributed constant line, a circuit which is a combination of a lumped constant and a distributed constant, an LC matching circuit, or the like is used.

Next, the operation of the Doherty amplifier according to Embodiment 1 will be explained.

First, a case in which an input signal of the first frequency lying in the first frequency band, concretely, 1.6 GHz is inputted to the input terminal 1 will be explained.

The input signal of the first frequency lying in the first frequency band is inputted to the splitter 4 via the third input matching circuit 3, and the splitter 4 splits the input signal inputted thereto to an input signal at the output end thereof and an input signal at the other output end thereof and outputs the input signals.

The input signal outputted from the output end of the splitter 4 undergoes a phase correction in the phase correction circuit 5 and is then inputted to the first filter circuit 6a, and the first filter circuit 6a filters the input signal inputted thereto and outputs a first input signal.

The filtering by the first filter circuit 6a provides a first input signal obtained by attenuating the input signal by the first amount of attenuation XdB because the input signal lies in the first frequency band.

The first input signal is inputted to the input end 8a1 of the first amplifier 8a via the first input matching circuit 7a.

The input signal outputted from the other output end of the splitter 4 is inputted to the second filter circuit 6b.

Because the input signal lies in the first frequency band, the second filter circuit 6b outputs a third input signal obtained by allowing passage of the input signal without attenuating the input signal.

The third input signal is inputted to the input end 8b1 of the second amplifier 8b via the second input matching circuit 7b.

When comparing the amplitude of the first input signal inputted to the input end 8a1 of the first amplifier 8a and the amplitude of the third input signal inputted to the input end 8b1 of the second amplifier 8b, the amplitude of the third input signal is larger than that of the first input signal because the first input signal is attenuated by XdB by the first filter circuit 6a.

Therefore, when the first amplifier 8a sweeps the amplitude (input power) of the first input signal from low input power to the saturation power, and when the second amplifier 8b sweeps the amplitude (input power) of the third input signal from low input power to the saturation power, the second amplifier 8b starts at an earlier time and the first amplifier 8a starts at a later time.

Therefore, the second amplifier 8b operates as the main amplifier while the first amplifier 8a operates as the auxiliary amplifier.

When an input signal of the first frequency lying in the first frequency band is inputted to the input terminal 1, the Doherty amplifier according to Embodiment 1 operates as the one in which the second amplifier 8b operates as the main amplifier while the first amplifier 8a operates as the auxiliary amplifier, and outputs the input signal of the first frequency inputted to the input terminal 1 from the output terminal 2 after amplifying the input signal.

Figure 5:
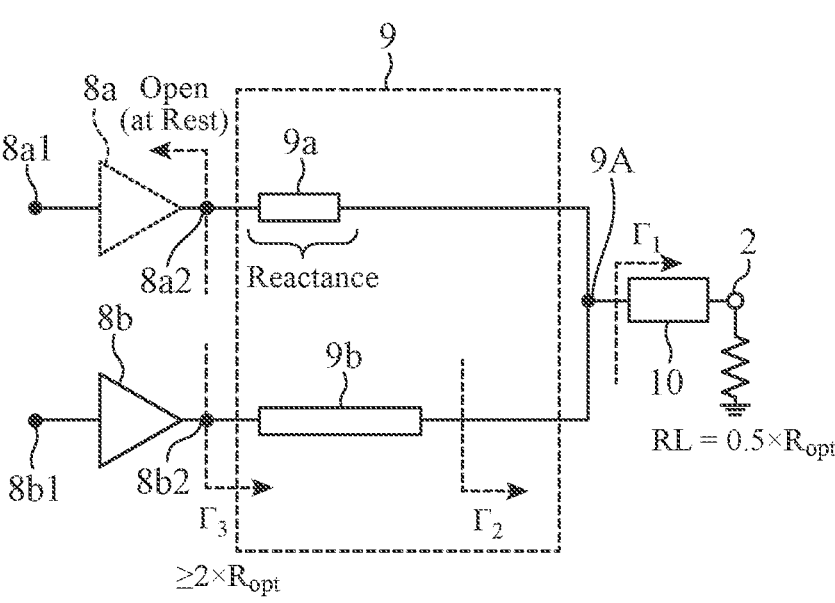
FIG. 5 is an equivalent circuit diagram showing the first amplifier, the second amplifier, and an output combining circuit, in order to show a relation among impedances at the time of backoff when an input signal having a first frequency (lying in a low frequency region) is inputted in the Doherty amplifier in Embodiment 1.

Hereinafter, the output load (output reflection coefficient) of the second amplifier 8b which operates as the main amplifier at the time of the backoff operation when an input signal of 1.6 GHz is inputted to the input terminal 1 will be considered using FIGS. 5 and 6.

Now; it is assumed that the optimal load at the time of the saturation power of each of the first and second amplifiers 8a, and 8b is $R_{opt}$, and the characteristic impedance of each of the first and second output circuits 9a and 9b is $R_{opt}$.

Because the first amplifier 8a operates as the auxiliary amplifier, the first amplifier 8a is placed in the off state, more specifically, at rest and the output end 8a2 of the first amplifier 8a is open at the time of the backoff operation.

The output load $\Gamma_1$ at the output combination point 9A is $0.5 \times R_{opt}$.

The output load $\Gamma_3$ in the second amplifier 8b increases from the output load $\Gamma_1$ ($=0.5 \times R_{opt}$) to $2 \times R_{opt}$ or more because of both the enlargement of the output reflection coefficient $\Gamma_2$ which depends on the reactiveness of the first output circuit 9a, and the load modulation by the second output circuit 9b.

Figure 6:
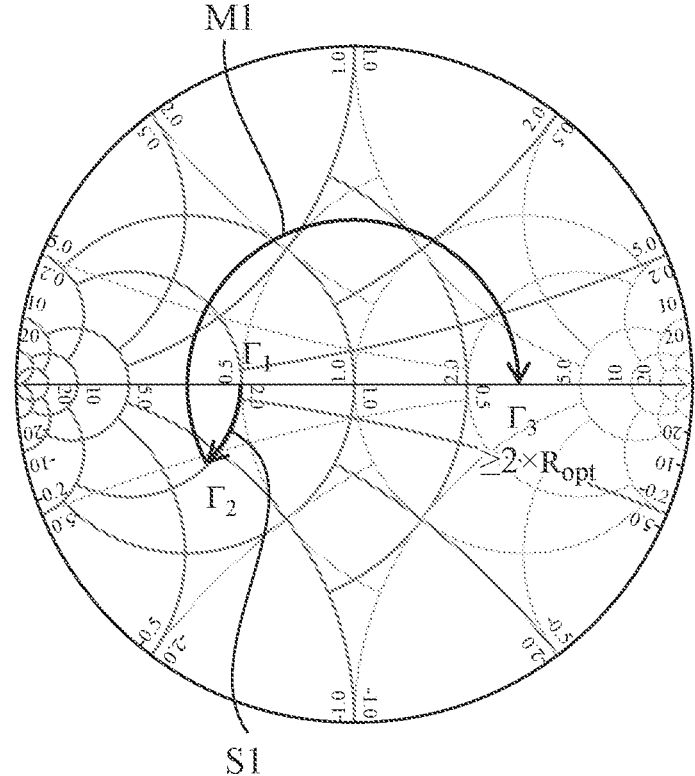
FIG. 6 is a view showing an impedance transformation in a Smith chart at the time of backoff when an input signal having the first frequency (lying in the low frequency region) is inputted in the Doherty amplifier in Embodiment 1.

More specifically, as the impedance transformation from $\Gamma_1$ to $\Gamma_3$ in the Smith chart, i.e., the state of the load modulation is shown in FIG. 6 as a typical locus in the first frequency band, the output load $\Gamma_3$ in the second amplifier 8b increases from the output load $\Gamma_1$ shown by a curve S1 to $2 \times R_{opt}$ or more because of both the enlargement so of the output reflection coefficient $\Gamma_2$ which depends on the reactiveness of the first output circuit 9a, and the load modulation by the second output circuit 9b shown by a curve M1.

At the time of the saturation power, both in the first amplifier 8a and in the second amplifier 8b, the output load is matched with $R_{opt}$.

As a result, the Doherty amplifier according to Embodiment 1 operates as the one in which when a 1.6 GHz input signal is inputted to the input terminal 1, because of the effect of the load modulation by the output combination circuit 9, the output load (output reflection coefficient) of the second amplifier 8b is increased to two or more times as large as the optimal load $R_{opt}$ at the time of the saturation power, and a high-efficiency load is achieved also at the time of the backoff operation when the output power is lower than the saturation power.

The input signal is not limited to a 1.6 GHz one, and the output load $\Gamma_3$ in the second amplifier 8b increases from the output load $\Gamma_1$ ($=0.5 \times R_{opt}$) to $2 \times R_{opt}$ or more with respect to the frequency lying in the first frequency band.

Next, a case in which an input signal of the second frequency lying in the second frequency band, concretely, 4.2 GHz is inputted to the input terminal 1 will be explained.

The input signal of the second frequency lying in the second frequency band is inputted to the splitter 4 via the third input matching circuit 3, and the splitter 4 splits the input signal inputted thereto to an input signal at the output end thereof and an input signal at the other output end thereof and outputs the input signals.

The input signal outputted from the output end of the splitter 4 undergoes a phase correction in the phase correction circuit 5 and is then inputted to the first filter circuit 6a.

Because the input signal lies in the second frequency band, the filtering by the first filter circuit 6a provides a second input signal obtained by allowing passage of the input signal without attenuating the input signal.

The second input signal is inputted to the input 8a1 of the first amplifier 8a via the first input matching circuit 7a.

The input signal outputted from the other output end of the splitter 4 is inputted to the second filter circuit 6b, and the second filter circuit 6b filters the input signal inputted thereto and outputs a fourth input signal.

The filtering by the second filter circuit 6b provides a fourth input signal obtained by attenuating the input signal by the first amount of attenuation XdB because the input signal lies in the second frequency band.

When comparing the amplitude of the second input signal inputted to the input end 8a1 of the first amplifier 8a and the amplitude of the fourth input signal inputted to the input end 8b1 of the second amplifier 8b, the amplitude of the second input signal is larger than that of the fourth input signal because the fourth input signal is attenuated by XdB by the second filter circuit 6b.

Therefore, when the first amplifier 8a sweeps the amplitude (input power) of the first input signal from low input power to the saturation power, and when the second amplifier 8b sweeps the amplitude (input power) of the third input signal from low input power to the saturation power, the first amplifier 8a starts at an earlier time and the second amplifier 8b starts at a later time.

Therefore, the first amplifier 8a operates as the main amplifier while the second amplifier 8b operates as the auxiliary amplifier.

When an input signal of the second frequency lying in the second frequency band is inputted to the input terminal 1, the Doherty amplifier according to Embodiment 1 operates as the one in which the first amplifier 8a operates as the main amplifier while the second amplifier 8b operates as the auxiliary amplifier, and outputs the input signal of the second frequency inputted to the input terminal 1 from the output terminal 2 after amplifying the input signal.

Figure 7:
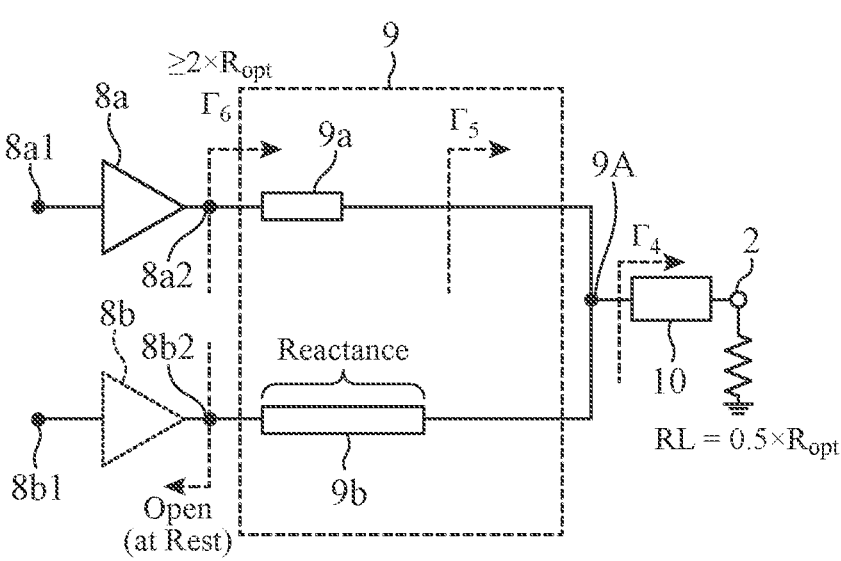
FIG. 7 is an equivalent circuit diagram showing the first amplifier, the second amplifier, and the output combining circuit, in order to show a relation among impedances at the time of backoff when an input signal having a second frequency (lying in a high frequency region) is inputted in the Doherty amplifier in Embodiment 1.
Figure 8:
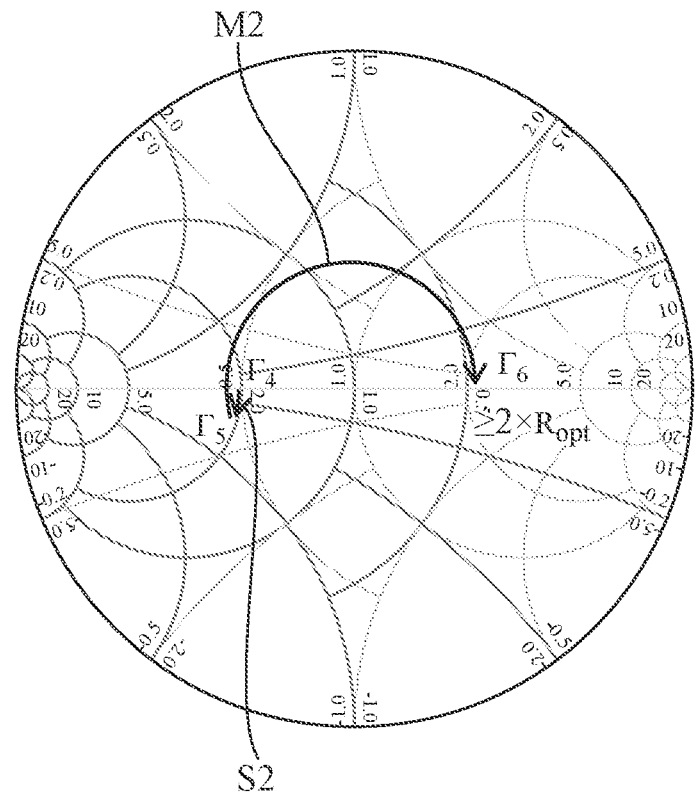
FIG. 8 is a view showing an impedance transformation in a Smith chart at the time of backoff when an input signal having the second frequency (lying in the high frequency region) is inputted in the Doherty amplifier in Embodiment 1.

Here, the output load (output reflection coefficient) of the second amplifier Sb that operates as the main amplifier at the time of the backoff operation when a 4.2 GHz input signal is inputted to the input terminal 1 is considered using FIGS. 7 and 8.

The optimal load of each of the first and second amplifiers 8a and 8b at the time of the saturation power, and the characteristic impedance of each of the first and second output circuits 9a and 9b are assumed to be $R_{opt}$ which is the same as that in the case where a 1.6 GHz input signal is inputted to the input terminal 1.

Because the second amplifier 8b operates as the auxiliary amplifier, the second amplifier 8b is placed in the off state, more specifically, at rest and the output end 8b2 of the second amplifier 8b is open at the time of the backoff operation.

The output load $\Gamma_4$ at the output combination point 9A is $0.5 \times R_{opt}$.

The output load $\Gamma_6$ in the first amplifier 8a increases from the output load $\Gamma_4$ (=$0.5 \times R_{opt}$) to $2 \times R_{opt}$ or more because of both the enlargement of the output reflection coefficient $\Gamma_5$ which depends on the reactiveness of the second output circuit 9b, and the load modulation by the first output circuit 9a.

More specifically, as the impedance transformation from $\Gamma_4$ to $\Gamma_6$ in the Smith chart, i.e., the state of the load modulation is shown in FIG. 8 as a typical locus in the second frequency band, the output load $\Gamma_6$ in the first amplifier 8a increases from the output load $\Gamma_4$ shown by a curve S2 to $2 \times R_{opt}$ or more because of both the enlargement of the output reflection coefficient $\Gamma_5$ which depends on the reactiveness of the second output circuit 9b, and the load modulation by the first output circuit 9a shown by a curve M2.

At the time of the saturation power, both in the first amplifier 8a and in the second amplifier 8b, the output load is matched with $R_{opt}$.

As a result, the Doherty amplifier according to Embodiment 1 operates as the one in which when a 4.2 GHz input signal is inputted to the input terminal 1, because of the effect of the load modulation by the output combination circuit 9, the output load (output reflection coefficient) of the first amplifier 8a is increased to two or more times as large as the optimal load $R_{opt}$ at the time of the saturation power, and a high-efficiency load is achieved also at the time of the backoff operation when the output power is lower than the saturation power.

The input signal is not limited to a 4.2 GHz one, and the output load $F_3$ in the second amplifier 8b increases from the output load $\Gamma_1$ (=$0.5 \times R_{opt}$) to $2 \times R_{opt}$ or more with respect to the frequency lying in the first frequency band.

Figure 9:
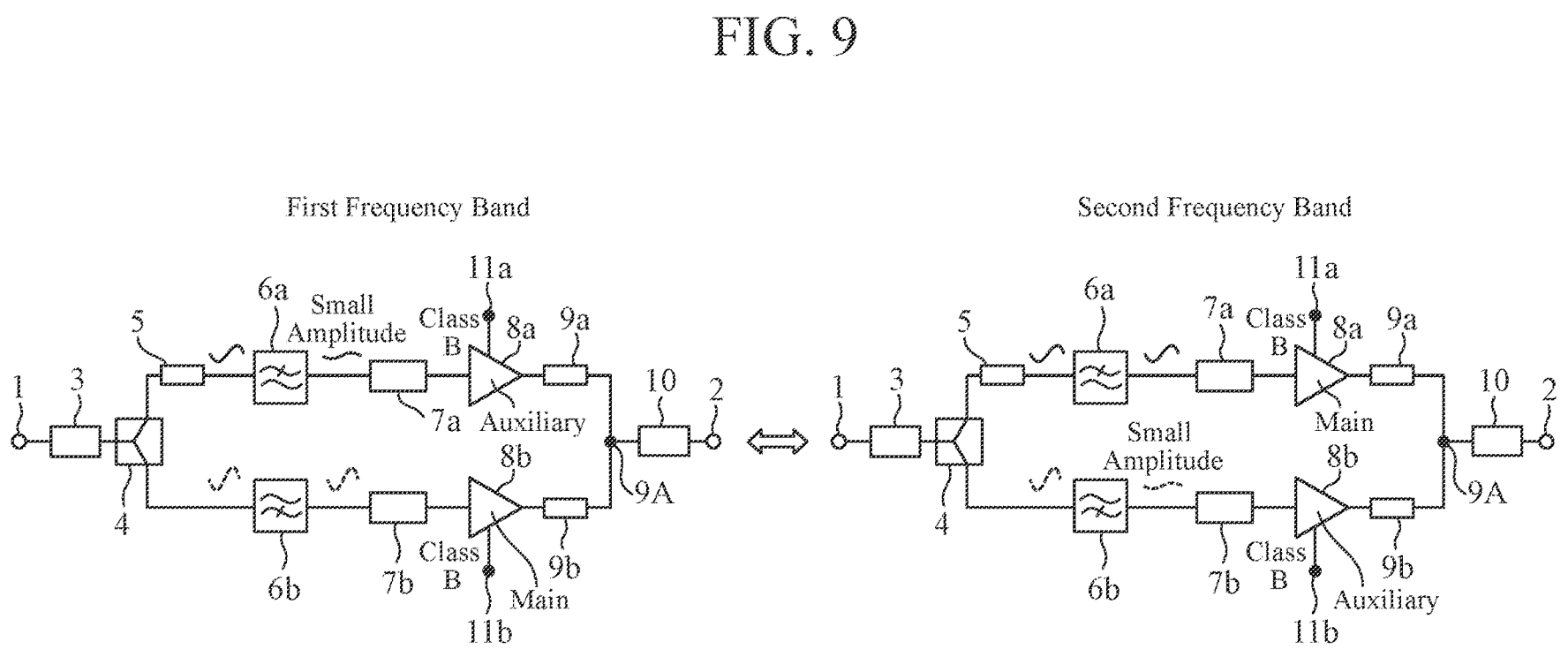

As can be seen from the above description, in the Doherty amplifier according to Embodiment 1, the operation of each of the first and second amplifiers 8a and 8b is switched between the one as the main amplifier and the one as the auxiliary amplifier in accordance with the amplitudes of the input signals inputted to the first and second amplifiers 8a and 8b in the state in which the gate bias voltage of each of the first and second amplifiers 8a and 8b is fixed to the one at which they operate as a class B amplifier, as the functions of the first and second amplifiers 8a and 8b when an input signal lying in the first frequency band is inputted and when an input signal lying in the second frequency band is inputted are schematically shown in FIG. 9.

As a result, the Doherty amplifier according to Embodiment 1 operates in multiple frequency bands which are an input signal lying in the first frequency band and an input signal lying in the second frequency band, without requiring the control of the gate bias voltage in the first amplifier 8a and the gate bias voltage in the second amplifier 8b.

Moreover, because of the effect of the load modulation of the output combination circuit 9, the Doherty amplifier according to Embodiment 1 operates as the one in which a high-efficiency load is achieved also at the time of the backoff operation when the output power is lower than the saturation power.

Figure 10:
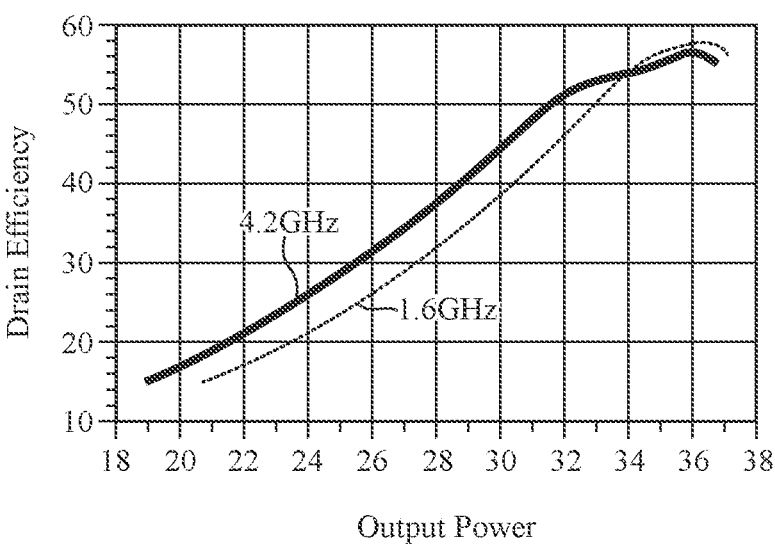
FIG. 10 is a view showing a drain efficiency with respect to output power, the drain efficiency being a simulation result, in the Doherty amplifier according to Embodiments 1.

In addition, the Doherty amplifier according to Embodiment 1 provides comparable drain efficiencies with respect to the output power when a 1.6 GHz input signal lying in the first frequency band is inputted to the input terminal 1 and when a 4.2 GHz input signal lying in the second frequency band is inputted to the input terminal 1, as shown in FIG. 10.

Embodiment 2

Figure 11:
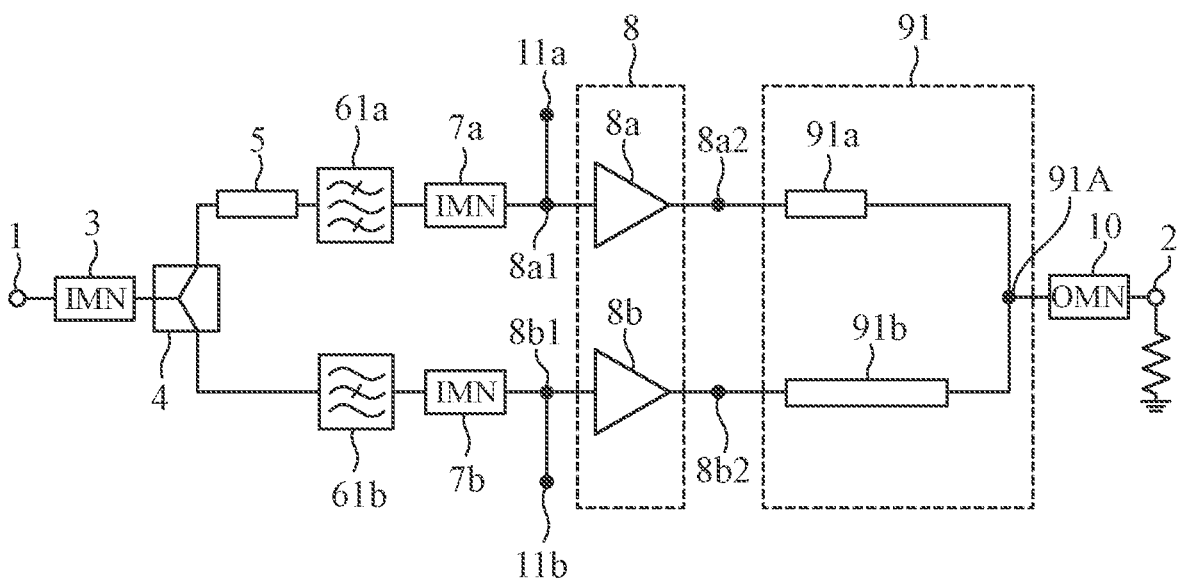
FIG. 11 is a block diagram showing a Doherty amplifier according to Embodiment 2.

A Doherty amplifier according to Embodiment 2 will be explained on the basis of FIGS. 11 to 13.

While the Doherty amplifier according to Embodiment 1 amplifies an input signal lying in the first frequency hand and an input signal lying in the second frequency band, the Doherty amplifier according to Embodiment 2 further amplifies an input signal in a third frequency band which is a frequency range different from the first and second frequency bands.

The third frequency band is a frequency range higher than the second frequency band.

Input signals inputted to two parallel amplifiers which constitute the Doherty amplifier satisfy a relation showing that when a second frequency lying in the second frequency band is assumed to be 1.0, a first frequency lying in the first frequency band is 0.5 with respect to the second frequency, and a third frequency lying in the third frequency band is 1.5 with respect to the second frequency.

The Doherty amplifier according to Embodiment 2 differs from the Doherty amplifier according to Embodiment 1 in a first filter circuit 61*a* and a second filter circuit 61*b*, and a output combination circuit 91 comprised of a first output circuit 91*a* and a second output circuit 91*b*, and the other components are the same as those of the Doherty amplifier according to Embodiment 1.

In each of the figures, the same reference signs denote the same components or like components.

When an input signal lying in the first frequency band is inputted the first filter circuit 61*a* outputs a first input signal obtained by attenuating the input signal lying in the first frequency band by a first amount of attenuation XdB, when an input signal lying in the second frequency band is inputted, the first filter circuit 6*a* outputs a second input signal obtained by allowing passage of the input signal lying in the second frequency band, and when an input signal lying in the third frequency band is inputted, the first filter circuit 6*a* outputs a fifth input signal obtained by attenuating the input signal lying in the third frequency band by a fourth amount of attenuation.

The fourth amount of attenuation is XdB which is the same as the first amount of attenuation. More specifically, when an input signal lying in the third frequency band is inputted, the first filter circuit 61*a* outputs a fifth input signal obtained by attenuating the input signal lying in the third frequency band by Xdb.

When the input signal lies in the first frequency band, the first filter circuit 61*a* outputs a signal having a small amplitude because the first input signal is attenuated by XdB, when the input signal lies in the second frequency band, the first filter circuit 61*a* outputs a signal having a large amplitude because the second input signal is not attenuated, and when the input signal lies in the third frequency band, the first filter circuit 61*a* outputs a signal having a small amplitude because the third input signal is attenuated by XdB.

The first filter circuit 61*a* is a hand pass filter circuit that when the input signal lies in the first frequency band and the third frequency band, attenuates the input signal, and when the input signal lies in the second frequency hand, allows passage of the input signal.

The first filter circuit 61*a* is a reactive hand pass filter circuit which is comprised of a reactive reflection loss, such as a filter circuit using a lumped constant element, a filter circuit using a distributed constant line, a filter circuit which is a combination of a lumped constant and a distributed constant, or a filter circuit using an LC matching circuit.

In a case where a reactive high pass filter circuit is used as the first filter circuit 61*a*, the downsizing of the first filter circuit 61*a* can be achieved.

As the first filter circuit 61*a*, a resistive band pass filter circuit such as an attenuator, instead of a reactive band pass filter circuit, may be used.

In a case where a resistive high pass filter circuit is used as the first filter circuit 61*a*, operational stability can be provided for the first amplifier 8*a* because the reflection power is lost in the first filter circuit 61*a*.

Further, as the first filter circuit 61*a*, a filter bank whose path for the input signal differs in accordance with the first through third frequency bands, instead of a band pass filter circuit, may be used.

When an input signal lying in the first frequency band is inputted, the second filter circuit 61*b* outputs a third input signal obtained by allowing passage of the input signal lying in the first frequency band, when an input signal lying in the second frequency band is inputted, the second filter circuit 61*b* outputs a fourth input signal obtained h attenuating the input signal lying in the second frequency band by the first amount of attenuation XdB, and when an input signal lying in the third frequency band is inputted, the second filter circuit 61*b* outputs a sixth input signal obtained by attenuating the input signal lying in the third frequency band by a fifth amount of attenuation smaller than the fourth amount of attenuation.

The fifth amount of attenuation is 0 dB. More specifically, when an input signal lying in the third frequency band is inputted, the second filter circuit 61*b* outputs a sixth input signal obtained by allowing passage of the input signal lying in the third frequency band.

When the input signal lies in the first frequency band, the second filter circuit 61*b* outputs a signal having a large amplitude because the third input signal is not attenuated, when the input signal lies in the second frequency band, the second filter circuit 61*b* outputs a signal having a small amplitude because the fourth input signal is attenuated by XdB, and when the input signal lies in the third frequency band, the second filter circuit 61*b* outputs a signal having a large amplitude because the sixth input signal is not attenuated.

The second filter circuit 61*b* is a band stop filter circuit that when the input signal lies in the first frequency band and the third frequency band, allows passage of the input signal, and when the input signal lies in the second frequency band, attenuates the input signal.

The second filter circuit 61*b* is a reactive band stop filter circuit which is comprised of a reactive reflection loss, such as a filter circuit using a lumped constant element, a filter circuit using a distributed constant line, a filter circuit which is a combination of a lumped constant and a distributed constant, or a filter circuit using an LC matching circuit.

In a case where a reactive high pass filter circuit is used as the second filter circuit 61*b*, the downsizing of the second filter circuit 61*b* can be achieved.

As the second filter circuit 61*b*, a resistive band stop filter circuit such as an attenuator, instead of a reactive band stop filter circuit, may be used.

In a case where a resistive high pass filter circuit is used as the second filter circuit 61*b*, operational stability can be provided for the second amplifier 8*b* because the reflection power is lost in the second filter circuit 61*b*.

Further, as the second filter circuit 61*b*, a filter bank whose path for the input signal differs in accordance with the first through third frequency bands, instead of a band stop filter circuit, may be used.

To sum up, what is necessary is just to set up the characteristics of the first filter circuit 6*a* and the second filter circuit 6*b* in such a way that when the input signal lies in the first frequency band, the amplitude of the first input signal outputted from the first filter circuit 61*a* is smaller than the amplitude of the third input signal outputted from the second filter circuit 61*b*, when the input signal lies in the second frequency band, the amplitude of the second input signal outputted from the first filter circuit 61*a* is larger than the amplitude of the fourth input signal outputted from the second filter circuit 61*b*, and when the input signal lies in the third frequency band, the amplitude of the fifth input signal outputted from the first filter circuit 61*a* is smaller than the amplitude of the sixth input signal outputted from the second filter circuit 61*b*.

The amount of attenuation XdB in the first filter circuit 61*a* with respect to the third frequency band is set to 6 dB, as an example, when it is desirable to improve the efficiency of the second amplifier 8b, or is set to 3 dB, as an example, when it is desirable to balance the efficiency and linearity of the second amplifier Sb.

Each of the first and second amplifiers 8a and 8b is biased to a threshold voltage at which each of the amplifiers operates as a class B amplifier, i.e., the threshold voltage of a transistor which constitutes each of the first and second amplifiers 8a and Sb.

The first amplifier 8a has an input end 8a1 connected to a gate bias terminal 11a at which a gate bias voltage is fixed, and when the first input signal outputted from the first filter circuit 61a is inputted to the input end 8a1 via a first input matching circuit 7a, the first amplifier 8a starts at a time later than the second amplifier 8b and operates as an auxiliary amplifier because the amplitude of the first input signal is smaller than the amplitude of the third input signal, when the second input signal so outputted from the first filter circuit 61a is inputted to the input end 8a1, the first amplifier 8a starts at a time earlier than the second amplifier 8b and operates as a main amplifier because the amplitude of the second input signal is larger than the amplitude of the fourth input signal, and when the fifth input signal outputted from the first filter circuit 61a is inputted to the input end Sal, the first amplifier 8a starts at a time later than the second amplifier 8b and operates as the auxiliary amplifier because the amplitude of the fifth input signal is smaller than the amplitude of the sixth input signal.

More specifically, when the input signal inputted to the input terminal 1 lies in the first frequency band, the first amplifier 8a operates as the auxiliary amplifier, when the input signal inputted to the input terminal 1 lies in the second frequency band, the first amplifier 8a operates as the main amplifier, and when the input signal inputted to the input terminal 1 lies in the third frequency band, the first amplifier 8a operates as the auxiliary amplifier.

In the first amplifier 8a, the saturation output power when operating as the main amplifier and the saturation output power when operating as the auxiliary amplifier are equal.

The second amplifier 8b has an input end 8b1 connected to a gate bias terminal 11b at which a gate bias voltage is fixed, and when the third input signal outputted from the second filter circuit 61b is inputted to the input end 8b1 via a second input matching circuit 7b, the second amplifier 8b starts at a time earlier than the first amplifier 8a and operates as the main amplifier because the amplitude of the third input signal is larger than the amplitude of the first input signal, when the fourth input signal outputted from the second filter circuit 61b is inputted to the input end 8b1, the second amplifier 8b starts at a time later than the second amplifier 8b and operates as the auxiliary amplifier because the amplitude of the fourth input signal is smaller than the amplitude of the second input signal, and when the sixth input signal outputted from the second filter circuit 61b is inputted to the input end 8b1, the second amplifier 8b starts at a time earlier than the first amplifier 8a and operates as the main amplifier because the amplitude of the sixth input signal is larger than the amplitude of the fifth input signal.

More specifically, when the input signal inputted to the input terminal 1 lies in the first frequency band, the second amplifier 8b operates as the main amplifier, when the input signal inputted to the input terminal 1 lies in the second frequency band, the second amplifier 8b operates as the auxiliary amplifier, and when the input signal inputted to the input terminal 1 lies in the third frequency band, the second amplifier 8b operates as the main amplifier.

In the second amplifier 8b, the saturation output power when operating as the main amplifier and the saturation output power when operating as the auxiliary amplifier are equal.

To sum up, although the functions and configurations of the first amplifier 8a and the second amplifier 8b are the same, the times that the first amplifier 8a and the second amplifier 8b start differ because the amplitudes of the input signals inputted to the first amplifier 8a and the second amplifier 8b differ because of the first filter circuit 61a and the second filter circuit 61b, as explained in the Doherty amplifier according to Embodiment 1.

Because of the difference between the times that the first amplifier 8a and the second amplifier 8b start, the output load impedances of the first amplifier 8a and the second amplifier 8b differ.

When the input signal lies in the first frequency band and the second frequency band, the first amplifier 8a and the second amplifier 8b operate in the same way that those of the Doherty amplifier according to Embodiment 1 operate.

When the input signal lies in the third frequency band, the time that the second amplifier 8b starts is earlier than the time that the first amplifier 8a starts, and the second amplifier 8b functions as the main amplifier while the first amplifier 8a functions as the auxiliary amplifier.

The output load impedance of the first amplifier 8a is sufficiently higher than that of the second amplifier 8b, for example, the output load impedance of the first amplifier 8a is ten or more times as high as that of the second amplifier 8b, and it can be assumed from the viewpoint of the load modulation of the Doherty amplifier that the first amplifier 8a is placed in an off state and the output of the first amplifier 8a is open.

At this time, because an output circuit having an electric length close to 90 degrees is provided on an output side of the second amplifier 8b because of the first output circuit 91a and the second output circuit 91b, and the output of the second amplifier 8b is in a load condition that a high degree of efficiency is achieved even at the time of low power output, the second amplifier 8b operates with a high degree of efficiency even at the time of low power output.

The first output circuit 91a is a transmission line having an electric length which is less than 90 degrees with respect to the first frequency band, which is equal to degrees with respect to the second frequency hand, and which is greater than or equal to 90 degrees with respect to the third frequency band, and its characteristic impedance is equal to an optimum load impedance at the time of the saturation power of the first amplifier 8a.

The first output circuit 91a is not limited to the transmission line, and should just satisfy the above-mentioned requirements.

In the first output circuit 91a, the electric length value which is less than 90 degrees with respect to the first frequency band ranges from less than 90 degrees to 45 degrees, for example.

The electric length value which is equal to 90 degrees with respect to the second frequency band contains 90 degrees itself and even a plus or minus design tolerance value with respect to the value of 90 degrees at which the load modulation making it possible to expect that the first amplifier 8a operates with the highest degree of efficiency in the second frequency band is established.

The electric length value which is greater than or equal to 90 degrees with respect to the third frequency band ranges up to 135 degrees, for example.

The second output circuit 91b is a transmission line having an electric length which is greater than 90 degrees with respect to the first frequency band, which is equal to 180 degrees with respect to the second frequency band, and which is less than 270 degrees with respect to the third frequency band, and its characteristic impedance is equal to an optimum load impedance at the time of the saturation power of the second amplifier 8b.

The second output circuit 91b is not limited to the transmission line, and should just satisfy the above-mentioned requirements.

In the second output circuit 91b, the electric length value which is greater than degrees with respect to the first frequency band ranges from more than 90 degrees to (90+16) degrees, for example.

The electric length value which is equal to 180 degrees with respect to the second frequency hand contains 180 degrees itself and even a plus or minus design tolerance value with respect to the value of 180 degrees at which the second amplifier 8b is placed in an off state in the second frequency band, the open load of the output end 8b2 is propagated, and the output end of the second output circuit 91b is open.

The electric length value which is less than 270 degrees with respect to the third frequency band ranges from less than 270 degrees to (270-16) degrees, for example.

To sum up, the output combination circuit 91 which is comprised of the first output circuit 91a and the second output circuit 91b should just have the characteristic of, at the time of the backoff operation, enlarging the output load (output reflection coefficient) of the main amplifier when the first amplifier 8a or the second amplifier Sb functions as the main amplifier in accordance with the frequency.

More specifically, the first output circuit 91a and the second output circuit 91b should just be configured in such a way as to have the characteristic of enlarging the output load (output reflection coefficient) of the first amplifier 8a in accordance with the frequency of the input signal because the first amplifier 8a functions as the main amplifier when the frequency band of the input signal is the second frequency band, and enlarging the output load (output reflection coefficient) of the second amplifier 8b in accordance with the frequency of the input signal because the second amplifier Sb functions as the main amplifier when the frequency band of the input signal is the first frequency band and the third frequency band.

No isolation is provided between the output end 8a2 of the first amplifier 8a and the output end 8b2 of the second amplifier 8b by the first output circuit 91a—an output combination point 91A—the second output circuit 91b.

Next, the operation of the Doherty amplifier according to Embodiment 2 will be explained.

When an input signal of the first frequency lying in the first frequency band, concretely, 1.6 GHz is inputted to the input terminal 1 and when an input signal of the second frequency lying in the second frequency band, concretely, 4.2 GHz is inputted to the input terminal 1, the Doherty amplifier operates in the same way that the Doherty amplifier according to Embodiment 1 operates.

Therefore, a case in which an input signal of the third frequency lying in the third frequency band, concretely, 6.3 GHz is inputted to the input terminal 1 will be explained.

An input signal of the third frequency lying in the third frequency band is inputted to a splitter 4 via a third input matching circuit 3, and the splitter 4 splits the input signal inputted thereto to an input signal at an output end thereof and an input signal at another output end thereof.

The input signal outputted from the output end of the splitter 4 undergoes a phase correction in a phase correction circuit 5 and is then inputted to the first filter circuit 61a, and the first filter circuit 61a filters the input signal inputted thereto and outputs a fifth input signal.

The filtering by the first filter circuit 61a provides a fifth input signal obtained by attenuating the input signal by XdB because the input signal lies in the third frequency band.

The fifth input signal is inputted to the input end 8a1 of the first amplifier 8a via the first input matching circuit 7a.

The input signal outputted from the other output end of the splitter 4 is inputted to the second filter circuit 61b.

Because the input signal lies in the third frequency band, the second filter circuit 61b outputs a sixth input signal obtained by allowing passage of the input signal without attenuating the input signal.

The sixth input signal is inputted to the input end 8b1 of the second amplifier 8b via the second input matching circuit 7b.

When comparing the amplitude of the fifth input signal inputted to the input end 8a1 of the first amplifier 8a and the amplitude of the sixth input signal inputted to the input end 8b1 of the second amplifier 8b, the amplitude of the sixth input signal is larger than that of the fifth input signal because the fifth input signal is attenuated by XdB by the first filter circuit 61a.

Therefore, when the first amplifier 8a sweeps the amplitude (input power) of the fifth input signal from low input power to the saturation power and when the second amplifier 8b sweeps the amplitude (input power) of the sixth input signal from low input power to the saturation power, the second amplifier 8b starts at an earlier time and the first amplifier 8a starts at a later time.

Therefore, the second amplifier 8b operates as the main amplifier while the first amplifier 8a operates as the auxiliary amplifier.

When an input signal of the third frequency lying in the third frequency band is inputted to the input terminal 1, the Doherty amplifier according to Embodiment 2 operates as the one in which the second amplifier 8b operates as the main amplifier while the first amplifier 8a operates as the auxiliary amplifier, and outputs the input signal of the third frequency inputted to the input terminal 1 from an output terminal 2 after amplifying the input signal.

Figure 12:
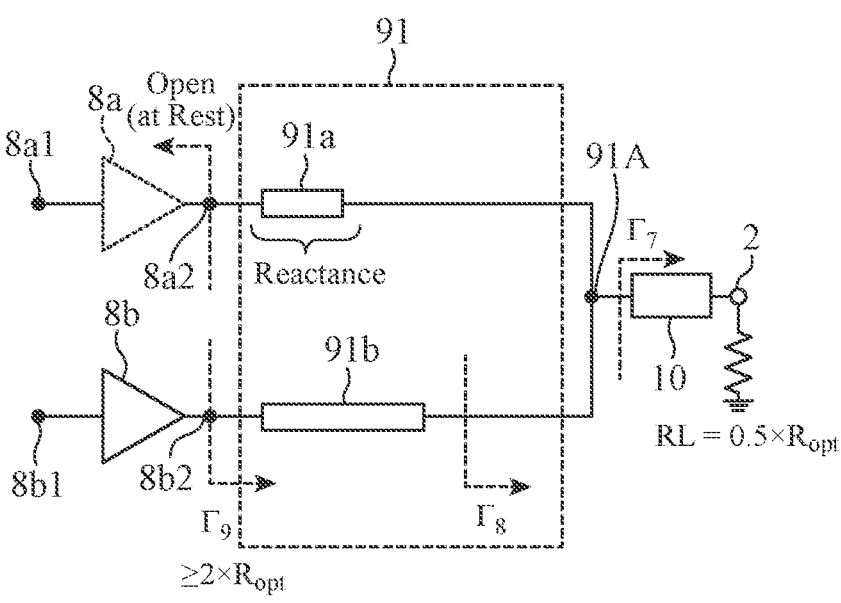
FIG. 12 is an equivalent circuit diagram showing a first amplifier, a second amplifier, and an output combining circuit, in order to show a relation among impedances at the time of backoff when an input signal having a third frequency is inputted in the Doherty amplifier in Embodiment 2.
Figure 13:
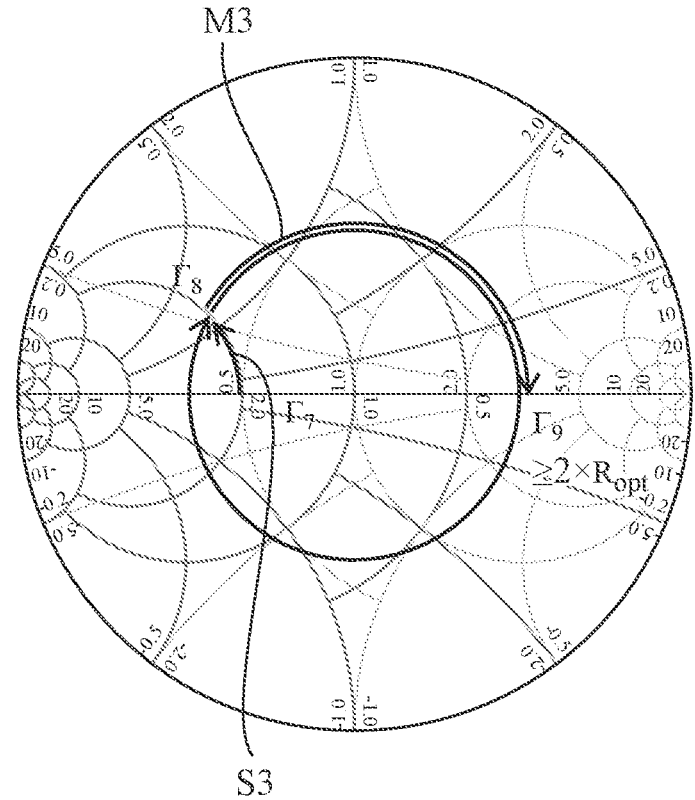
FIG. 13 is a view showing an impedance transformation in a Smith chart at the time of backoff when an input signal having the third frequency is inputted in the Doherty amplifier in Embodiment 2.

Here, the output load (output reflection coefficient) of the second amplifier 8b that operates as the main amplifier at the time of the backoff operation when a third input signal is inputted to the input terminal 1 is considered using FIGS. 12 and 13.

The optimal load of each of the first and second amplifiers 8a and 8b at the time of the saturation power, and the characteristic impedance of each of the first and second output circuits 91a and 91b are assumed to be $R_{opt}$ which is the same as that in the case where input signals of the first frequency and the second frequency is inputted to the input terminal 1.

Because the first amplifier 8a operates as the auxiliary amplifier, the first amplifier 8a is placed in the off state, more specifically, at rest and the output end 8a2 of the first amplifier 8a is open at the time of the backoff operation.

The output load $\Gamma_7$ at the output combination point 91A is $0.5 \times R_{opt}$.

The output load $\Gamma_9$ in the second amplifier 8b increases from the output load $\Gamma_7$ ($=0.5 \times R_{opt}$) to $2 \times R_{opt}$ or more because of both the enlargement of the output reflection coefficient $\Gamma_8$ which depends on the reactiveness of the first output circuit 91a, and the load modulation by the second output circuit 91b.

More specifically, as the impedance transformation from $\Gamma_7$ to $\Gamma_9$ in a Smith chart, i.e., the state of the load modulation is shown in FIG. 13 as a typical locus in the third frequency band, the output load $F_9$ in the second amplifier 8b increases from the output load $\Gamma_7$ shown by a curve S3 to $2 \times R_{opt}$ or more because of both the enlargement of the output reflection coefficient $\Gamma_8$ which depends on the reactiveness of the first output circuit 91a, and the load modulation by the second output circuit 91b shown by a curve M3.

At the time of the saturation power, both in the first amplifier 8a, and in the second amplifier 8b, the output load is matched with $R_{opt}$.

As a result, the Doherty amplifier according to Embodiment 2 operates as the one in which when a third input signal is inputted to the input terminal 1, because of the effect of the load modulation by the output combination circuit 9, the output load (output reflection coefficient) of the second amplifier 8b is increased to two or more times as large as the optimal load $R_{opt}$ at the time of the saturation power, and a high-efficiency load is achieved also at the time of the backoff operation when the output power is lower than the saturation power.

As can be seen from the above description, in the Doherty amplifier according to Embodiment 2, the operation of each of the first and second amplifiers 8a and 8b is switched between the one as the main amplifier and the one as the auxiliary amplifier in accordance with the amplitudes of the input signals inputted to the first and second amplifiers 8a and 8b in a state in which the gate bias voltage of each of the first and second amplifiers 8a and 8b is fixed to the one at which they operate as a class B amplifier.

As a result, the Doherty amplifier according to Embodiment 2 operates in multiple frequency bands which are an input signal lying in the first frequency band, an input signal lying in the second frequency band, and an input signal lying in the third frequency band without requiring the control of the gate bias voltage in the first amplifier 8a and the gate bias voltage in the second amplifier 8b.

In addition to providing the same advantageous effect as that of the Doherty amplifier according to Embodiment 1, the Doherty amplifier according to Embodiment 2 operates as the one in which, also when an input signal lying in the third frequency band is inputted, a high-efficiency load is achieved also at the time of the backoff operation when the output power is lower than the saturation power because of the effect of the load modulation of the output combination circuit 9.

Although the Doherty amplifier according to Embodiment 1 is aimed at amplifying an input signal lying in the first frequency band and an input signal lying in the second frequency band, and the Doherty amplifier according to Embodiment 2 is aimed at amplifying an input signal lying in one of the first through third frequency bands, there can be provided a Doherty amplifier further aimed at signals lying in a fourth frequency band, in a fifth frequency band, and in higher frequency bands.

In the case of aiming at input signals lying in four or more frequency bands, what is necessary is just to reverse the frequency bands in which the first filter circuit 6a and the second filter circuit 6b perform the passage and the attenuation, alternately reverse each frequency band between one in which the passage is performed and one in which the attenuation is performed, and cause the output combination circuit 9 comprised of the first output circuit 9a and the second output circuit 9b to have the characteristic of, at the time of the backoff operation, enlarging the output load (output reflection coefficient) of the main amplifier when the first amplifier 8a or the second amplifier 8b functions as the main amplifier in accordance with the frequency.

The output circuit of the main amplifier when the first amplifier 8a or the second amplifier 8b functions as the main amplifier in accordance with a higher frequency is set up in such a way that a relation of (90 degrees+180 degrees×n)(n is a natural number) holds.

Further, the first filter circuit 6a and the second filter circuit 6b are comprised of filter banks.

It is to be understood that an arbitrary combination of embodiments can be made, a change can be made in an arbitrary component of each of the embodiments, or an arbitrary component in each of the embodiments can be omitted.

INDUSTRIAL APPLICABILITY

The Doherty amplifier according to the present disclosure is suitable for amplifiers, such as amplifiers used for mobile communication base stations, which amplify a signal for communications with a high degree of efficiency.

REFERENCE SIGNS LIST

1: Input terminal, 2: Output terminal, 3: Third input matching circuit, 4: Splitter, 5: Phase correction circuit, 6a and 61a: First filter circuit, 6b and 61b: Second filter circuit, 7a: First input matching circuit, 7b: Second input matching circuit, 8: Two Parallel amplifiers, 8a: First amplifier, 8b: Second amplifier, 9: Output combination circuit, 9a and 91a: First output circuit, 9b and 91b: Second output circuit, 10: Output matching circuit, and 11a and 11b: Gate bias terminal.

The invention claimed is:

1. A Doherty amplifier comprising:

a first filter circuit to, when an input signal lying in a first frequency band is inputted, output a first input signal obtained by attenuating the input signal lying in the first frequency band by a first amount of attenuation, and to, when an input signal lying in a second frequency band different from the first frequency band is inputted, output a second input signal obtained by allowing passage of the input signal lying in the second frequency band;

a second filter circuit to, when an input signal lying in the first frequency band is inputted, output a third input signal obtained by attenuating the input signal lying in the first frequency band by a second amount of attenuation smaller than the first amount of attenuation, and to, when an input signal lying in the second frequency band is inputted, output a fourth input signal obtained by attenuating the input signal lying in the second frequency band by a third amount of attenuation larger than or equal to the first amount of attenuation;

a first amplifier in which a gate bias voltage is fixed, to operate as an auxiliary amplifier when the first input signal from the first filter circuit is inputted, and to operate as a main amplifier when the second input signal from the first filter circuit is inputted; and a second amplifier in which a gate bias voltage is fixed, to operate as the main amplifier when the third input signal from the second filter circuit is inputted, and to operate as the auxiliary amplifier when the fourth input signal from the second filter circuit is inputted.

2. The Doherty amplifier according to claim 1, wherein the gate bias voltage applied to the first amplifier is a threshold voltage of the first amplifier, and the gate bias voltage applied to the second amplifier is a threshold voltage of the second amplifier.

3. The Doherty amplifier according to claim 1, wherein the second amount of attenuation is 0 dB, and the third amount of attenuation is identical to the first amount of attenuation.

4. The Doherty amplifier according to claim 1, wherein the second frequency band is higher than the first frequency band, the first filter circuit is a high pass filter circuit, and the second filter circuit is a low pass filter circuit.

5. The Doherty amplifier according to claim 4, wherein to the high pass filter is comprised of a reactive filter circuit.

6. The Doherty amplifier according to claim 4, wherein the high pass filter is comprised of a resistive filter circuit.

7. The Doherty amplifier according to claim 1, wherein the Doherty amplifier includes:

a first output circuit having an input end connected to an output end of the first amplifier, an output end connected to an output combination point, and an electric length which is less than 90 degrees with respect to the first frequency band; and a second output circuit having an input end connected to an output end of the second amplifier, an output end connected to the output combination point, and an electric length which is greater than 90 degrees with respect to the first frequency band.

8. The Doherty amplifier according to claim 1, wherein the Doherty amplifier includes: a first output circuit having an input end connected to an output end of the first amplifier, an output end connected to an output combination point, and an electric length which is equal to 90 degrees with respect to the second frequency band; and a second output circuit having an input end connected to an output end of the second amplifier, an output end connected to the output combination point, and an electric length which is equal to 180 degrees with respect to the second frequency band.

9. The Doherty amplifier according to claim 1, wherein the Doherty amplifier includes:

a first output circuit having an input end connected to an output end of the first amplifier, an output end connected to an output combination point, and an electric length which is less than 90 degrees with respect to the first frequency band and which is equal to 90 degrees with respect to the second frequency band, and a second output circuit having an input end connected to an output end of the second amplifier, an output end connected to the output combination point, and an electric length which is greater than 90 degrees with respect to the first frequency band and which is equal to 180 degrees with respect to the second frequency band.

10. The Doherty amplifier according to claim 1, wherein when an input signal lying in a third frequency band different from the first and second frequency bands is inputted, the first filter circuit outputs a fifth input signal obtained by attenuating the input signal lying in the third frequency band by a fourth amount of attenuation, and when an input signal lying in the third frequency band is inputted, the second filter circuit outputs a sixth input signal obtained by attenuating the input signal lying in the third frequency band by a fifth amount of attenuation smaller than the fourth amount of attenuation, and the first amplifier operates as the auxiliary amplifier when the fifth input signal from the first filter circuit is inputted, and the second amplifier operates as the main amplifier when the sixth input signal from the second filter circuit is inputted.

11. The Doherty amplifier according to claim 10, wherein the fourth amount of attenuation is identical to the first amount of attenuation, and the fifth amount of attenuation is zero.

12. The Doherty amplifier according to claim 10, wherein the second frequency band is higher than the first frequency band, the third frequency band is higher than the second frequency band, the first filter circuit is a band pass filter circuit, and the second filter circuit is a band stop filter circuit.

13. The Doherty amplifier according to claim 12, wherein the band pass filter is comprised of a reactive filter circuit.

14. The Doherty amplifier according to claim 12, wherein the band pass filter is comprised of a resistive filter circuit.

15. The Doherty amplifier according to claim 10, wherein the Doherty amplifier includes:

a first output circuit having an input end connected to an output end of the first amplifier, an output end connected to an output combination point, and an electric length which is less than 90 degrees with respect to the first frequency band; and a second output circuit having an input end connected to an output end of the second amplifier, an output end connected to the output combination point, and an electric length which is greater than 90 degrees with respect to the first frequency band.

16. The Doherty amplifier according to claim 10, wherein the Doherty amplifier includes:

a first output circuit having an input end connected to an output end of the first amplifier, an output end connected to an output combination point, and an electric length which is equal to 90 degrees with respect to the second frequency band; and a second output circuit having an input end connected to an output end of the second amplifier, an output end connected to the output combination point, and an electric length which is equal to 180 degrees with respect to the second frequency band.

17. The Doherty amplifier according to claim 10, wherein the Doherty amplifier includes:

a first output circuit having an input end connected to an output end of the first amplifier, an output end connected to an output combination point, and an electric length which is greater than or equal to 90 degrees with respect to the third frequency hand; and a second output circuit having an input end connected to an output end of the second amplifier, an output end connected to the output combination point, and an electric length which is less than 270 degrees with respect to the third frequency band.

18. The Doherty amplifier according to claim 10, wherein to the Doherty amplifier includes:

a first output circuit having an input end connected to an output end of the first amplifier, an output end connected to an output combination point, and an electric length which is less than 90 degrees with respect to the first frequency band, which is equal to 90 degrees with respect to the second frequency band, and which is greater than or equal to 90 degrees with respect to the third frequency hand; and a second output circuit having an input end connected to an output end of the second amplifier, an output end connected to the output combination point, and an electric length which is greater than 90 degrees with respect to the first frequency band, which is equal to 180 degrees with respect to the second frequency band, and which is less than 270 degrees with respect to the third frequency band.

\* \* \* \* \*